US010277990B2

United States Patent
Thomsen et al.

(10) Patent No.: US 10,277,990 B2
(45) Date of Patent: Apr. 30, 2019

(54) ADAPTIVE LEVEL ESTIMATOR, A HEARING DEVICE, A METHOD AND A BINAURAL HEARING SYSTEM

(71) Applicant: Oticon A/S, Smørum (DK)

(72) Inventors: Anders Højsgaard Thomsen, Smørum (DK); Jan Petersen, Smørum (DK); Jan Mark De Haan, Smørum (DK)

(73) Assignee: OTICON A/S, Smørum (DK)

( * ) Notice: Subject to any disclaimer, the term of this patent is extended or adjusted under 35 U.S.C. 154(b) by 0 days.

(21) Appl. No.: 15/885,969

(22) Filed: Feb. 1, 2018

(65) Prior Publication Data
US 2018/0220242 A1    Aug. 2, 2018

(30) Foreign Application Priority Data

Feb. 2, 2017 (EP) .................................. 17154383

(51) Int. Cl.
*H03G 9/00* (2006.01)
*H04R 25/00* (2006.01)
(Continued)

(52) U.S. Cl.
CPC ........... *H04R 25/505* (2013.01); *G06F 3/165* (2013.01); *H03G 9/005* (2013.01); *H03G 9/025* (2013.01); *H04R 25/356* (2013.01); *H04R 25/552* (2013.01); *H04R 25/554* (2013.01); *H04R 29/001* (2013.01); *H04R 2225/41* (2013.01); *H04R 2225/43* (2013.01)

(58) Field of Classification Search
USPC ........ 381/23.1, 72, 312, 314, 316, 321, 328, 381/330
See application file for complete search history.

(56) References Cited

U.S. PATENT DOCUMENTS

2011/0013794 A1\*  1/2011  Hau ..................... H04R 25/356
                                                        381/321
2012/0129480 A1\*  5/2012  Ruelke .................. H04B 1/001
                                                        455/296

(Continued)

FOREIGN PATENT DOCUMENTS

WO    WO 03/081947 A1    10/2003

*Primary Examiner* — Yosef K Laekemariam
(74) *Attorney, Agent, or Firm* — Birch, Stewart, Kolasch & Birch, LLP

(57) ABSTRACT

An adaptive level estimator for providing a level estimate of an electric input signal representing sound is provided. The adaptive level estimator comprises
- a first level estimator configured to provide a first level estimate of the electric input signal in a first number K1 of frequency bands;
- a second level estimator configured to provide a second level estimate of the electric input signal and/or associated attack/release time constants in a second number K2 of frequency bands, wherein K2 is smaller than K1; and
- a level control unit receiving said first and second level estimates and configured to provide said resulting level estimate based on said first and said second level estimates and/or said associated attack/release time constants.

The invention may e.g. be used in devices or applications that benefit from a dynamic adaptation of an input signal level to a listener's (possibly limited) dynamic range of sound level perception, or to any other specific dynamic range deviating from that of the environment sound.

19 Claims, 10 Drawing Sheets

(51) Int. Cl.
*H04R 29/00* (2006.01)
*G06F 3/16* (2006.01)
*H03G 9/02* (2006.01)

(56) References Cited

U.S. PATENT DOCUMENTS

2012/0177205 A1* 7/2012 Bramslow .............. H03G 9/025
381/23.1
2013/0243227 A1 9/2013 Kinsbergen et al.

* cited by examiner

ADAPTIVE LEVEL ESTIMATOR, A HEARING DEVICE, A METHOD AND A BINAURAL HEARING SYSTEM

SUMMARY

The present disclosure deals with dynamic estimation of levels of an input signal representing sound, e.g. for use in an audio device, such as a hearing aid.

In the present disclosure, it is proposed
- to provide a high resolution level estimate of an input signal in relatively many (e.g. 16 or more) frequency bands;
- to provide a low resolution level estimate and/or associated attack/release time constants of the input signal in relatively few (e.g. 8 or less) frequency bands, and
- to determine a resulting level estimate in dependence of the high resolution level estimate and of the low resolution level estimate and/or associated attack/release time constants (associated with the low resolution level estimate).

A Level Estimator:

In an aspect of the present application, an adaptive level estimator for providing a level estimate of an electric input signal representing sound is provided. The adaptive level estimator comprises
- a first level estimator configured to provide a first level estimate of the electric input signal in a first number K1 of frequency bands;
- a second level estimator configured to provide a second level estimate of the electric input signal and/or associated attack/release time constants (said attack/release time constants being associated with said second level estimate) in a second number K2 of frequency bands, wherein K2 is smaller than K1; and
- a level control unit (receiving said first and said second level estimates and) configured to provide a resulting level estimate based on said first and said second level estimates and/or said associated attack/release time constants.

Thereby an improved level estimation may be provided.

It is to be understood that the second level estimator is configured to provide a second level estimate and/or attack/release time constants associated with said second level estimate, in a second number K2 of frequency bands (i.e. one of A) $LE2(k)$, B) $\tau_{2a}(k)$, $\tau_{2r}(k)$, and C) $LE2(k)$ and $\tau_{2att}(k)$, $\tau_{2rel}(k)$, where k=1, ..., K2, $LE2(k)$ is (frequency dependent) level estimates of the second level estimator, and $\tau_{2att}(k)$ and $\tau_{2rel}(k)$ are (possibly frequency dependent) attack and release times for the second level estimator, respectively.

The level estimate is dynamically provided in dependence of a current input signal, e.g. its dynamic properties (e.g. the timing properties (e.g. a rate change) of frequency dependent level changes). In an embodiment, the first number K1 of frequency bands is larger than 4, such as larger than or equal to 16, such as larger than or equal to 24. In an embodiment, the second number K2 of frequency bands is smaller than or equal to 16, such as smaller than or equal to 8, such as smaller than or equal to 4 (e.g. equal to 2 or 1). In an embodiment, the first number K1 of frequency bands is larger than or equal to 16, while the second number K2 of frequency bands is smaller than 16, such as smaller than or equal to 8, such as smaller than or equal to 4 (e.g. equal to 2 or 1). In an embodiment, the number K of frequency sub-bands of the electric input signal is equal to the the first number K1 of frequency bands. In an embodiment, the number K of frequency sub-bands of the electric input signal is larger than or equal to 32, such as larger than or equal to 64, such as larger than or equal to 128.

In an embodiment, the first level estimator is configured to provide the first level estimate with a first time constant, and the second level estimator is configured to provide the second level estimate with a second time constant, wherein the first time constant is larger than or equal to the second time constant. In an embodiment, the first and second time constants $\tau_1$ and $\tau_2$ are frequency band specific ($\tau_1(k)$, k=1, ..., K1, and $\tau_2(k)$, k=1, ..., K2, where k is a frequency index). In an embodiment, $\tau_1(k) \geq \tau_2(k)$ (or $\tau_1(k) > \tau_2(k)$) for all k. In an embodiment, at least two of the frequency dependent time constants of each respective first and second time constants are different (e.g. in that $\tau_1(k)$, for at least two of k=1, ..., K1 are different (e.g. $\tau_1(1) \neq \tau_1(K)$), and e.g. in that $\tau_2(k)$, for at least two of k=1, ..., K2 are different (e.g. $\tau_2(1) \neq \tau_2(K)$)). In an embodiment, first and/or second time constants comprise individual attack ($\tau_{ia}(k)$) and release ($\tau_{ir}(k)$) time constants ($\tau_{1a}(k)$, $\tau_{1r}(k)$), and ($\tau_{2a}(k)$, $\tau_{2r}(k)$), respectively. In an embodiment, $\tau_{1a}(k) \geq \tau_{2a}(k)$, and $\tau_{1r}(k) \geq \tau_{2r}(k)$ for all relevant k. In an embodiment, $\tau_{1a}(k) \leq \tau_{1r}(k)$, and $\tau_{2a}(k) \leq \tau_{2r}(k)$ for all relevant k. In an embodiment, the first and second time constants are equal (or essentially equal). In an embodiment, the first and/or second time constant(s) is/are or the order of 1 ms, e.g. between 0.5 ms and 4 ms, e.g. between 1 and 3 ms. In an embodiment, the second time constant(s) is/are of the order of 10 ms, e.g. between 5 ms and 20 ms.

In an embodiment, the level control unit is configured to provide that the resulting level estimate fades between the first and second level estimates, e.g. according to a fading scheme, such as an adaptive fading scheme, e.g. in dependence of the electric input signal and the first and second time constants.

In an embodiment, the level control unit is configured to provide the resulting level estimate based on the first and second level estimates and a signal to noise ratio of the electric input signal.

In an embodiment, the level control unit comprises a comparison unit for comparing the first and second level estimates, and providing a comparison signal indicative of the comparison. In an embodiment, the resulting level estimate is based on a comparison of the first and second level estimates. In an embodiment, the level control unit is configured to base the resulting level estimate on the comparison signal. In an embodiment, the comparison signal is indicative of a difference between the first and second level estimates (e.g. in a linear or in a logarithmic representation, e.g. an absolute value, or other appropriate functional relationship). In an embodiment, the resulting level estimate is based on a ratio between the first and second level estimates (or between the second and the first level estimates).

In an embodiment, the level control unit comprises a filtering unit for down-sampling or low pass filtering the comparison signal, and providing a filtered comparison signal. In an embodiment, the control unit is configured to use the filtered comparison signal in the determination of the resulting level estimate. Thereby it can be achieved that the high resolution (first) level estimates are used (or mainly used) as the resulting level estimates for slow changes in the sound level estimate whereas the low resolution (second) level estimates are used (or mainly used) as the resulting level estimates for fast changes in the sound level estimate.

In an embodiment, the level control unit comprises a combination unit for combining the filtered comparison signal or a signal derived therefrom with the second level estimate and providing a combined signal. In an embodiment, the control unit is configured to use the combined signal in the determination of the resulting level estimate.

In an embodiment, the level control unit comprises a limiter configured to limit the effect of the comparison signal on the resulting level estimate. The limiter may provide a smaller change in, or set a cap on, the resulting change in the level estimate for a given change in the comparison signal (than if no limiter is present). In an embodiment, the limiter is configured to limit the effect of the comparison signal on the resulting level estimate to a predefined or adaptively determined amount. In an embodiment, the predefined amount is 10 dB. In an embodiment, the level control unit is configured to limit the deviation of the resulting level estimate from the second level estimate to a predefined amount, e.g. 10 dB.

In an embodiment, the first and/or second level estimator comprises a dynamic level estimator providing an estimate of a level of an input signal to the dynamic level estimator, wherein attack and/or release time constant(s) is/are configurable in dependence of the input signal to the dynamic level estimator. In an embodiment, the dynamic level estimator comprises a relatively fast level estimator connected to a guided level estimator, both receiving the input signal to the dynamic level estimator. The guided level estimator is configured to provide the estimate of the level of the input signal (to the dynamic level estimator), wherein an attack and/or release time of the guided level estimator is determined in dependence of a difference between a level estimate of the guided level estimator and the relatively fast level estimator. In an embodiment, the dynamic level estimator comprises a level estimator as described in WO2003081947A1 (cf. also FIG. 7A, 7B).

In an embodiment, the adaptive level estimator comprises at least one calibrator for calibrating a level estimate to a particular type of sound signals. In an embodiment, a particular type of sound signals is speech (e.g. in quiet or in noise), or music, or noise. In an embodiment, the calibrator is configured to calibrate a level estimate to a specific standardized or other documented calibration scheme. In an embodiment, the calibrator is configured to calibrate a level estimate to an average long term speech spectrum (LTASS), e.g. in accordance with IEC60118-15. In an embodiment, the adaptive level estimator comprises at least two calibrators adapted to calibrate the first and second level estimates, e.g. optimized to the same type of sound signals, e.g. according to the same calibration scheme. In an embodiment, the at least two calibrators are adapted to calibrate the first and second level estimates according to different types of sound signals, e.g. according to different calibration schemes. In an embodiment, the first level estimate is calibrated to a first type of signals, e.g. noise. In an embodiment, the second level estimate is calibrated to second type of signals, e.g. speech. In an embodiment, the adaptive level estimator comprises at least three calibrators adapted to calibrate the first and second level estimates, and the resulting level estimate (e.g. optimized to the same type of sound signals, e.g. according to the same calibration scheme).

A Hearing Device:

In an aspect, a hearing device, e.g. a hearing aid, comprising an adaptive level estimator as described above, in the detailed description of embodiments, and in the claims is furthermore provided by the present disclosure.

In an embodiment, the hearing device comprises an input unit for providing an electric input signal representing sound in a frequency sub-band representation IN(k,m), where k is a frequency sub-band index, k=1, . . . , K, where K is the number of frequency sub-bands, and m is a time-frame index. In an embodiment, the first number K1 of frequency bands is smaller than or equal to the number K of frequency sub-bands of the electric input signal. In an embodiment, the hearing device comprises a first band conversion unit for providing the electric input signal, or a processed version thereof, in K1 frequency bands (e.g. based on K frequency sub-bands) for use by the first level estimator of the adaptive level estimator. In an embodiment, the hearing device comprises a second band conversion unit for providing the electric input signal, or a processed version thereof, in K2 frequency bands (e.g. based on K or K1 frequency sub-bands) for use by the second level estimator of the adaptive level estimator. In an embodiment, the first and second band conversion units are implemented as band-sum units, where the contents of a given output frequency band is the sum of the contents (or a weighted average value; or an average value, e.g. a statistical average) of the input frequency bands spanning the output frequency band. In an embodiment, the first and second band conversion units are implemented as max band units, where the contents of a given output frequency band is the maximum value of the contents of the input frequency bands spanning the output frequency band. In an embodiment, only the magnitude of the input signal is considered for level estimation. In an embodiment, the hearing device, e.g. the adaptive level estimator comprises an ABS unit for providing magnitude values of the input signal or of a signal derived therefrom. In an embodiment, the hearing device comprises a third band conversion unit for providing the second level estimate, or a processed version thereof, in K1 frequency bands for use in the level control unit (converting from K2 to K1 bands). In an embodiment, the hearing device comprises a fourth band conversion unit for providing the resulting level estimate, or a processed version thereof, in K frequency bands for use in a level to gain conversion unit, e.g. forming part of a signal processor (converting from K1 to K bands). In an embodiment, the third and fourth band conversion units are frequency band distribution units for providing output levels (e.g. the second level estimate and the resulting level estimate in K1 bands (instead of K2 bands, where K1>K2) and in K bands (instead of K1 bands, where K≥K1). In an embodiment, K≥K1.

In an embodiment, the hearing device comprises an output unit for providing stimuli perceivable to a user as sound originating from the electric input signal. In an embodiment, the hearing device, e.g. the output unit comprises a synthesis filter bank for converting frequency sub-band signals to a single time-domain signal. In an embodiment, the single time-domain signal form the basis for generating the stimuli perceivable as sound. In an embodiment, the output unit comprises a loudspeaker for providing the stimuli as sound waves in air. In an embodiment, the output unit comprises a vibrator for providing the stimuli as sound waves in bone, e.g. the skull of the user. In an embodiment, the output unit comprises a multi-electrode array for providing the stimuli as electric stimuli of the user's cochlear nerve.

In an embodiment, the hearing device comprises a level to gain conversion unit for converting the resulting level to a resulting gain. In an embodiment, the level to gain conversion unit is configured to implement a compression strategy for a specific application. In an embodiment, the level to gain conversion unit is configured to implement a compression strategy for a specific user, e.g. a hearing impaired user.

In an embodiment, the hearing device is constituted by or comprises a hearing aid, a headset, an earphone, an ear protection device or a combination thereof.

In an embodiment, the hearing device is adapted to provide a frequency dependent gain and/or a level dependent compression and/or a transposition (with or without frequency compression) of one or frequency ranges to one or more other frequency ranges, e.g. to compensate for a hearing impairment of a user. In an embodiment, the hearing device comprises a signal processor for processing the input signals and providing a processed output signal.

In an embodiment, the hearing device comprises an output unit for providing a stimulus perceived by the user as an acoustic signal based on a processed electric signal. In an embodiment, the output unit comprises a number of electrodes of a cochlear implant or a vibrator of a bone conducting hearing device. In an embodiment, the output unit comprises an output transducer. In an embodiment, the output transducer comprises a receiver (loudspeaker) for providing the stimulus as an acoustic signal to the user. In an embodiment, the output transducer comprises a vibrator for providing the stimulus as mechanical vibration of a skull bone to the user (e.g. in a bone-attached or bone-anchored hearing device).

In an embodiment, the hearing device comprises an input unit for providing an electric input signal representing sound. In an embodiment, the input unit comprises an input transducer, e.g. a microphone, for converting an input sound to an electric input signal. In an embodiment, the input unit comprises a wireless receiver for receiving a wireless signal comprising sound and for providing an electric input signal representing the sound. In an embodiment, the hearing device comprises a directional microphone system adapted to spatially filter sounds from the environment, and thereby enhance a target acoustic source among a multitude of acoustic sources in the local environment of the user wearing the hearing device. In an embodiment, the directional system is adapted to detect (such as adaptively detect) from which direction a particular part of the microphone signal originates. This can be achieved in various different ways as e.g. described in the prior art.

In an embodiment, the hearing device comprises an antenna and transceiver circuitry for wirelessly receiving a direct electric input signal from another device, e.g. a communication device or another hearing device. In an embodiment, the hearing device comprises a (possibly standardized) electric interface (e.g. in the form of a connector) for receiving a wired direct electric input signal from another device, e.g. a communication device or another hearing device. In an embodiment, the direct electric input signal represents or comprises an audio signal and/or a control signal and/or an information signal. In an embodiment, the hearing device comprises demodulation circuitry for demodulating the received direct electric input to provide the direct electric input signal representing an audio signal and/or a control signal e.g. for setting an operational parameter (e.g. volume) and/or a processing parameter of the hearing device. In general, a wireless link established by a transmitter and antenna and transceiver circuitry of the hearing device can be of any type. In an embodiment, the wireless link is used under power constraints, e.g. in that the hearing device comprises a portable (typically battery driven) device. In an embodiment, the wireless link is a link based on near-field communication, e.g. an inductive link based on an inductive coupling between antenna coils of transmitter and receiver parts. In another embodiment, the wireless link is based on far-field, electromagnetic radiation.

In an embodiment, the communication via the wireless link is arranged according to a specific modulation scheme, e.g. an analogue modulation scheme, such as FM (frequency modulation) or AM (amplitude modulation) or PM (phase modulation), or a digital modulation scheme, such as ASK (amplitude shift keying), e.g. On-Off keying, FSK (frequency shift keying), PSK (phase shift keying), e.g. MSK (minimum shift keying), or QAM (quadrature amplitude modulation).

Preferably, communication between the hearing device and another device is based on some sort of modulation at frequencies above 100 kHz. Preferably, frequencies used to establish a communication link between the hearing device and the other device is below 50 GHz, e.g. located in a range from 50 MHz to 70 GHz, e.g. above 300 MHz, e.g. in an ISM range above 300 MHz, e.g. in the 900 MHz range or in the 2.4 GHz range or in the 5.8 GHz range or in the 60 GHz range (ISM=Industrial, Scientific and Medical, such standardized ranges being e.g. defined by the International Telecommunication Union, ITU). In an embodiment, the wireless link is based on a standardized or proprietary technology. In an embodiment, the wireless link is based on Bluetooth technology (e.g. Bluetooth Low-Energy technology).

In an embodiment, the hearing device is portable device, e.g. a device comprising a local energy source, e.g. a battery, e.g. a rechargeable battery.

In an embodiment, the hearing device comprises a forward or signal path between an input transducer (microphone system and/or direct electric input (e.g. a wireless receiver)) and an output transducer. In an embodiment, the signal processor is located in the forward path. In an embodiment, the signal processor is adapted to provide a frequency dependent gain according to a user's particular needs. In an embodiment, the hearing device comprises an analysis path comprising functional components for analyzing the input signal (e.g. determining a level, a modulation, a type of signal, an acoustic feedback estimate, etc.). In an embodiment, some or all signal processing of the analysis path and/or the signal path is conducted in the frequency domain. In an embodiment, some or all signal processing of the analysis path and/or the signal path is conducted in the time domain.

In an embodiment, an analogue electric signal representing an acoustic signal is converted to a digital audio signal in an analogue-to-digital (AD) conversion process, where the analogue signal is sampled with a predefined sampling frequency or rate $f_s$, $f_s$ being e.g. in the range from 8 kHz to 48 kHz (adapted to the particular needs of the application) to provide digital samples $x_n$ (or $x[n]$) at discrete points in time $t_n$ (or n), each audio sample representing the value of the acoustic signal at $t_n$ by a predefined number $N_b$ of bits, $N_b$ being e.g. in the range from 1 to 48 bits, e.g. 24 bits. Each audio sample is hence quantized using $N_b$ bits (resulting in $2^{Nb}$ different possible values of the audio sample). A digital sample x has a length in time of $1/f_s$, e.g. 50 µs, for $f_s$=20 kHz. In an embodiment, a number of audio samples are arranged in a time frame. In an embodiment, a time frame comprises 64 or 128 audio data samples. Other frame lengths may be used depending on the practical application.

In an embodiment, the hearing devices comprise an analogue-to-digital (AD) converter to digitize an analogue input with a predefined sampling rate, e.g. 20 kHz. In an embodiment, the hearing devices comprise a digital-to-analogue (DA) converter to convert a digital signal to an analogue output signal, e.g. for being presented to a user via an output transducer.

In an embodiment, the hearing device, e.g. the microphone unit, and or the transceiver unit comprise(s) a TF-conversion unit for providing a time-frequency representation of an input signal. In an embodiment, the time-frequency representation comprises an array or map of corresponding complex or real values of the signal in question in a particular time and frequency range. In an embodiment, the TF conversion unit comprises a filter bank for filtering a (time varying) input signal and providing a number of (time varying) output signals each comprising a distinct frequency range of the input signal. In an embodiment, the TF conversion unit comprises a Fourier transformation unit for converting a time variant input signal to a (time variant) signal in the frequency domain. In an embodiment, the frequency range considered by the hearing device from a minimum frequency $f_{min}$ to a maximum frequency $f_{max}$ comprises a part of the typical human audible frequency range from 20 Hz to 20 kHz, e.g. a part of the range from 20 Hz to 12 kHz. In an embodiment, a signal of the forward and/or analysis path of the hearing device is split into a number NI of frequency bands, where NI is e.g. larger than 5, such as larger than 10, such as larger than 50, such as larger than 100, such as larger than 500, at least some of which are processed individually. In an embodiment, the hearing device is/are adapted to process a signal of the forward and/or analysis path in a number NP of different frequency channels (NP≤NI). The frequency channels may be uniform or non-uniform in width (e.g. increasing in width with frequency), overlapping or non-overlapping.

In an embodiment, the hearing device comprises a number of detectors configured to provide status signals relating to a current physical environment of the hearing device (e.g. the current acoustic environment), and/or to a current state of the user wearing the hearing device, and/or to a current state or mode of operation of the hearing device. Alternatively or additionally, one or more detectors may form part of an external device in communication (e.g. wirelessly) with the hearing device. An external device may e.g. comprise another hearing device, a remote control, and audio delivery device, a telephone (e.g. a Smartphone), an external sensor, etc.

In an embodiment, one or more of the number of detectors operate(s) on the full band signal (time domain). In an embodiment, one or more of the number of detectors operate(s) on band split signals ((time-) frequency domain).

In a particular embodiment, the hearing device comprises a voice detector (VD) for determining whether or not an input signal comprises a voice signal (at a given point in time). A voice signal is in the present context taken to include a speech signal from a human being. It may also include other forms of utterances generated by the human speech system (e.g. singing). In an embodiment, the voice detector unit is adapted to classify a current acoustic environment of the user as a VOICE or NO-VOICE environment. This has the advantage that time segments of the electric microphone signal comprising human utterances (e.g. speech) in the user's environment can be identified, and thus separated from time segments only comprising other sound sources (e.g. artificially generated noise). In an embodiment, the voice detector is adapted to detect as a VOICE also the user's own voice. Alternatively, the voice detector is adapted to exclude a user's own voice from the detection of a VOICE.

In an embodiment, the hearing device comprises an own voice detector for detecting whether a given input sound (e.g. a voice) originates from the voice of the user of the system. In an embodiment, the microphone system of the hearing device is adapted to be able to differentiate between a user's own voice and another person's voice and possibly from NON-voice sounds.

In an embodiment, the hearing device comprises a classification unit configured to classify the current situation based on input signals from (at least some of) the detectors, and possibly other inputs as well. In the present context 'a current situation' is taken to be defined by one or more of
a) the physical environment (e.g. including the current electromagnetic environment, e.g. the occurrence of electromagnetic signals (e.g. comprising audio and/or control signals) intended or not intended for reception by the hearing device, or other properties of the current environment than acoustic;
b) the current acoustic situation (input level, feedback, etc.), and
c) the current mode or state of the user (movement, temperature, etc.);
d) the current mode or state of the hearing device (program selected, time elapsed since last user interaction, etc.) and/or of another device in communication with the hearing device.

In an embodiment, the hearing device further comprises other relevant functionality for the application in question, e.g. feedback suppression, noise reduction, etc.

In an embodiment, the hearing device comprises a listening device, e.g. a hearing aid, e.g. a hearing instrument, e.g. a hearing instrument adapted for being located at the ear or fully or partially in the ear canal of a user, e.g. a headset, an earphone, an ear protection device or a combination thereof.

Use:

In an aspect, use of a hearing device as described above, in the 'detailed description of embodiments' and in the claims, is moreover provided. In an embodiment, use is provided in a system comprising audio distribution, e.g. a system comprising a microphone and a loudspeaker. In an embodiment, use is provided in a system comprising one or more hearing instruments, headsets, ear phones, active ear protection systems, etc., e.g. in handsfree telephone systems, teleconferencing systems, public address systems, karaoke systems, classroom amplification systems, etc.

A Method:

In an aspect, a method of dynamic estimation of a level of an input signal representing sound is furthermore provided by the present application. The method comprises
  providing a first level estimate of the electric input signal in a first number K1 of frequency bands;
  providing a second level estimate of the electric input signal and/or associated attack/release time constants (said attack/release time constants being associated with said second level estimate) in a second number K2 of frequency bands, wherein K2 is smaller than K1; and
  providing a resulting level estimate based on said first and said second level estimates and/or said associated attack/release time constants.

It is intended that some or all of the structural features of the device described above, in the 'detailed description of embodiments' or in the claims can be combined with embodiments of the method, when appropriately substituted by a corresponding process and vice versa. Embodiments of the method have the same advantages as the corresponding devices.

A Computer Readable Medium:

In an aspect, a tangible computer-readable medium storing a computer program comprising program code means for causing a data processing system to perform at least some (such as a majority or all) of the steps of the method described above, in the 'detailed description of embodiments' and in the claims, when said computer program is executed on the data processing system is furthermore provided by the present application.

By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. In addition to being stored on a tangible medium, the computer program can also be transmitted via a transmission medium such as a wired or wireless link or a network, e.g. the Internet, and loaded into a data processing system for being executed at a location different from that of the tangible medium.

A Data Processing System:

In an aspect, a data processing system comprising a processor and program code means for causing the processor to perform at least some (such as a majority or all) of the steps of the method described above, in the 'detailed description of embodiments' and in the claims is furthermore provided by the present application.

A Computer Program:

A computer program (product) comprising instructions which, when the program is executed by a computer, cause the computer to carry out (steps of) the method described above, in the 'detailed description of embodiments' and in the claims is furthermore provided by the present application.

A Hearing System:

In a further aspect, a hearing system (e.g. a binaural hearing system) comprising first and second hearing device as described above, in the 'detailed description of embodiments', and in the claims, the hearing system being adapted to establish a communication link between the first and second hearing device.

In an embodiment, the hearing system comprises an auxiliary device, the hearing system being adapted to provide that information can be exchanged between at least one of the first and second hearing devices and the auxiliary device or forwarded from at least one of the first and second hearing devices to the auxiliary device. In an embodiment, the hearing system is adapted to implement a binaural hearing system, e.g. a binaural hearing aid system.

In an embodiment, the hearing system is adapted to establish respective communication links between the first and second hearing device(s) and between the hearing device(s) and the auxiliary device to provide that information (e.g. control and status signals, e.g. level estimates, possibly audio signals) can be exchanged or forwarded from one to the other (e.g. directly from one hearing device to the other or via the auxiliary device, or directly between the auxiliary device and any of the first and second hearing devices, or between the auxiliary device and a given one of the hearing devices (either directly or via the other hearing device).

In an embodiment, the auxiliary device is or comprises a remote control for controlling functionality and operation of the hearing device(s). In an embodiment, the function of a remote control is implemented in a SmartPhone, the SmartPhone possibly running an APP allowing to control the functionality of the hearing system via the SmartPhone (the hearing device(s) comprising an appropriate wireless interface to the SmartPhone, e.g. based on Bluetooth or some other standardized or proprietary scheme).

In the present context, a SmartPhone, may comprise
- a (A) cellular telephone comprising a microphone, a speaker, and a (wireless) interface to the public switched telephone network (PSTN) COMBINED with
- a (B) personal computer comprising a processor, a memory, an operative system (OS), a user interface (e.g. a keyboard and display, e.g. integrated in a touch sensitive display) and a wireless data interface (including a Web-browser), allowing a user to download and execute application programs (APPs) implementing specific functional features (e.g. displaying information retrieved from the Internet, remotely controlling another device, combining information from various sensors of the smartphone (e.g. camera, scanner, GPS, microphone, etc.) and/or external sensors to provide special features, etc.).

An APP:

In a further aspect, a non-transitory application, termed an APP, is furthermore provided by the present disclosure. The APP comprises executable instructions configured to be executed on an auxiliary device to implement a user interface for a hearing device or a (e.g. binaural) hearing system described above in the 'detailed description of embodiments', and in the claims. In an embodiment, the APP is configured to run on cellular phone, e.g. a smartphone, or on another portable device allowing communication with said hearing device or said hearing system.

In an embodiment, the non-transitory application is configured to allow a configuration of the adaptive level estimator in a hearing device and/or in the first and second hearing devices of a (e.g. binaural) hearing system according to the present disclosure to be performed via said user interface.

Definitions

In the present context, a 'hearing device' refers to a device, such as e.g. a hearing instrument or an active ear-protection device or other audio processing device, which is adapted to improve, augment and/or protect the hearing capability of a user by receiving acoustic signals from the user's surroundings, generating corresponding audio signals, possibly modifying the audio signals and providing the possibly modified audio signals as audible signals to at least one of the user's ears. A 'hearing device' further refers to a device such as an earphone or a headset adapted to receive audio signals electronically, possibly modifying the audio signals and providing the possibly modified audio signals as audible signals to at least one of the user's ears. Such audible signals may e.g. be provided in the form of acoustic signals radiated into the user's outer ears, acoustic signals transferred as mechanical vibrations to the user's inner ears through the bone structure of the user's head and/or through parts of the middle ear as well as electric signals transferred directly or indirectly to the cochlear nerve of the user.

The hearing device may be configured to be worn in any known way, e.g. as a unit arranged behind the ear with a tube leading radiated acoustic signals into the ear canal or with a loudspeaker arranged close to or in the ear canal, as a unit entirely or partly arranged in the pinna and/or in the ear canal, as a unit attached to a fixture implanted into the skull bone, as an entirely or partly implanted unit, etc. The hearing device may comprise a single unit or several units communicating electronically with each other.

More generally, a hearing device comprises an input transducer for receiving an acoustic signal from a user's surroundings and providing a corresponding input audio signal and/or a receiver for electronically (i.e. wired or wirelessly) receiving an input audio signal, a (typically configurable) signal processing circuit (e.g. a signal processor, e.g. comprising a configurable (programmable) processor, e.g. a digital signal processor) for processing the input audio signal and an output unit for providing an audible signal to the user in dependence on the processed audio signal. The signal processor may be adapted to process the input signal in the time domain or in a number of frequency bands. In some hearing devices, an amplifier and/or compressor may constitute the signal processing circuit. The signal processing circuit typically comprises one or more (integrated or separate) memory elements for executing programs and/or for storing parameters used (or potentially used) in the processing and/or for storing information relevant for the function of the hearing device and/or for storing information (e.g. processed information, e.g. provided by the signal processing circuit), e.g. for use in connection with an interface to a user and/or an interface to a programming device. In some hearing devices, the output unit may comprise an output transducer, such as e.g. a loudspeaker for providing an air-borne acoustic signal or a vibrator for providing a structure-borne or liquid-borne acoustic signal. In some hearing devices, the output unit may comprise one or more output electrodes for providing electric signals (e.g. a multi-electrode array for electrically stimulating the cochlear nerve).

In some hearing devices, the vibrator may be adapted to provide a structure-borne acoustic signal transcutaneously or percutaneously to the skull bone. In some hearing devices, the vibrator may be implanted in the middle ear and/or in the inner ear. In some hearing devices, the vibrator may be adapted to provide a structure-borne acoustic signal to a middle-ear bone and/or to the cochlea. In some hearing devices, the vibrator may be adapted to provide a liquid-borne acoustic signal to the cochlear liquid, e.g. through the oval window. In some hearing devices, the output electrodes may be implanted in the cochlea or on the inside of the skull bone and may be adapted to provide the electric signals to the hair cells of the cochlea, to one or more hearing nerves, to the auditory brainstem, to the auditory midbrain, to the auditory cortex and/or to other parts of the cerebral cortex.

A 'hearing system' refers to a system comprising one or two hearing devices, and a 'binaural hearing system' refers to a system comprising two hearing devices and being adapted to cooperatively provide audible signals to both of the user's ears. Hearing systems or binaural hearing systems may further comprise one or more 'auxiliary devices', which communicate with the hearing device(s) and affect and/or benefit from the function of the hearing device(s). Auxiliary devices may be e.g. remote controls, audio gateway devices, mobile phones (e.g. SmartPhones), public-address systems, car audio systems or music players.

Hearing devices, hearing systems or binaural hearing systems may e.g. be used for compensating for a hearing-impaired person's loss of hearing capability, augmenting or protecting a normal-hearing person's hearing capability and/or conveying electronic audio signals to a person.

Embodiments of the disclosure may e.g. be useful in applications such as devices or applications that benefit from a dynamic adaptation of an input signal level to a listener's (possibly limited) dynamic range of sound level perception, or to any other specific dynamic range deviating from that of the environment sound. The disclosure may e.g. be useful in applications such as hearing aids, headsets, ear phones, active ear protection systems, handsfree telephone systems, mobile telephones, teleconferencing systems, public address systems, karaoke systems, classroom amplification systems, etc.

BRIEF DESCRIPTION OF DRAWINGS

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effect will be apparent from and elucidated with reference to the illustrations described hereinafter in which:

The figures are schematic and simplified for clarity, and they just show details which are essential to the understanding of the disclosure, while other details are left out. Throughout, the same reference signs are used for identical or corresponding parts.

Further scope of applicability of the present disclosure will become apparent from the detailed description given hereinafter. However, it should be understood that the detailed description and specific examples, while indicating preferred embodiments of the disclosure, are given by way of illustration only. Other embodiments may become apparent to those skilled in the art from the following detailed description.

DETAILED DESCRIPTION OF EMBODIMENTS

The detailed description set forth below in connection with the appended drawings is intended as a description of various configurations. The detailed description includes specific details for the purpose of providing a thorough understanding of various concepts. However, it will be apparent to those skilled in the art that these concepts may be practised without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

The electronic hardware may include microprocessors, microcontrollers, digital signal processors (DSPs), field programmable gate arrays (FPGAs), programmable logic devices (PLDs), gated logic, discrete hardware circuits, and other suitable hardware configured to perform the various functionality described throughout this disclosure. Computer program shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Figure 1:
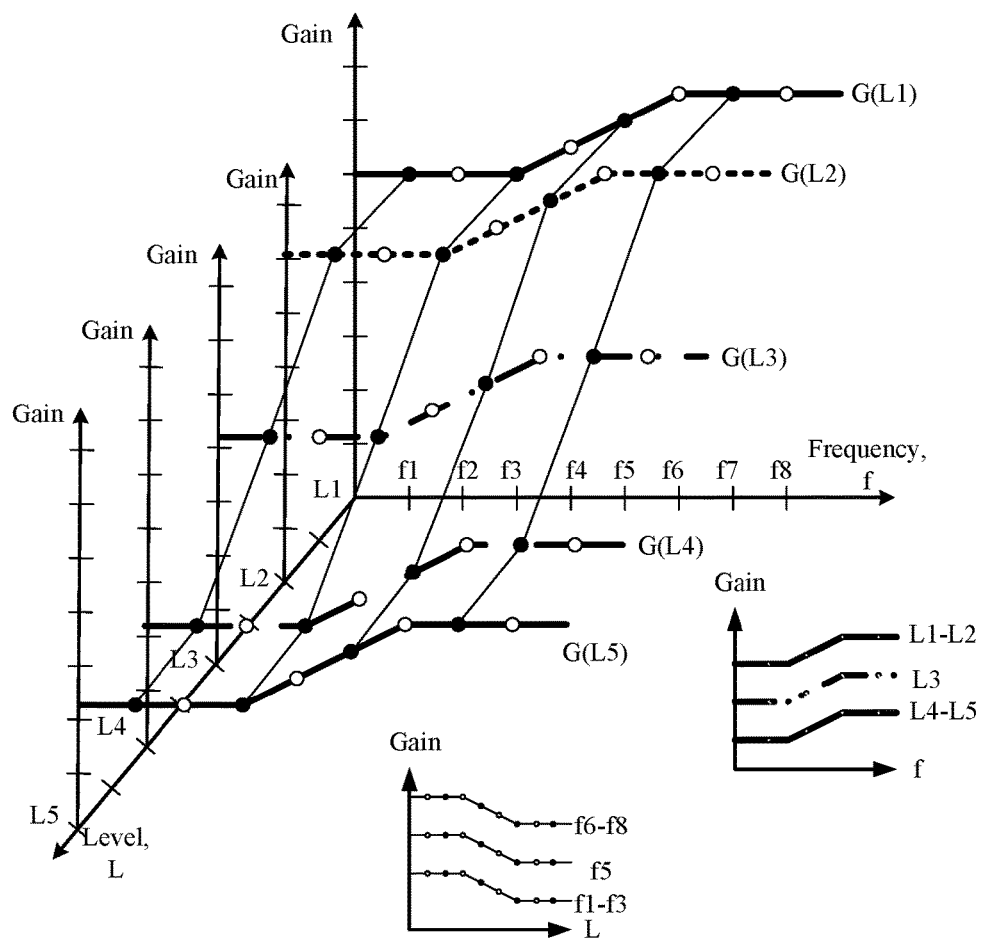
FIG. 1 schematically shows an exemplary level to gain map, e.g. of a normally hearing or of a hearing impaired user.

The present application relates to the field of audio processing, e.g. hearing devices, such as hearing aids, headsets or mobile telephones. Level estimation is important for providing a proper adaptation of environment sound levels to a user's needs. Such adaptation is sometimes termed compressive amplification, indicating that to optimize a particular user's perception of current sound levels in his or her environment, some levels should be compressed, while other levels should be amplified. A compressive amplification scheme for a given application or a particular user is e.g. defined by a compression characteristic curve that maps input level $L_{IN}$ to gain G (and thus provides a desired output level, $L_{OUT}=G \cdot L_{IN}$). The gain G (which can be larger or smaller than one, i.e. represent amplification or compression, respectively) is typically—in addition to being dependent on input level—frequency dependent, $G=G(L_{IN},f)$, where f is frequency, or $G(L_{IN},k)$ where k is a frequency index (e.g. a frequency band index). A schematic example of such level-to-gain map (G(L,f)) is shown in FIG. 1, illustrating the combination of two general trends a) that the need for gain decreases with increasing input level (intuitively obvious) and b) that the need for gain increases with increasing frequency (reflecting properties of the human auditory system that is more sensitive at lower frequencies and more prone to damage/age at higher frequencies). FIG. 1 shows five (schematic) gain (Gain, G) versus frequency (f) curves at different levels (Level, L) of the input signal in a three dimensional (orthogonal) coordinate system with level and frequency axes spanning a horizontal plane and gain being associated with a vertical axis. Schematic (intended) gain values (G) versus frequency are indicated for five different levels (L1, L2, L3, L4, L5) of an input signal (each graph corresponding to a certain input level being indicated by a specific line style, G(L1)-solid, G(L2)-dotted, G(L3)-dash-dotted, G(L4)-dashed and G(L5)-solid). The intended gain values may e.g. represent a specific user's need for compressive amplification during a particular type of acoustic situation, e.g. speech in quiet (as e.g. determined by a fitting rationale, e.g. NAL-NL1). The gain at each level is indicated at eight different frequencies (f1, f2, f3, f4, f5, f6, f7, f8), gain values for odd frequencies f1, f3, f5, f7 being indicated by filled circles, while gain values for even frequencies f2, f4, f6, f8 being indicated by open circles. In the lower right part of FIG. 1, the respective gain versus frequency curves for different levels are indicated in two-dimensional Gain(f) plots with level (L1-L5) as a parameter. Similarly, in lower middle part of FIG. 1, the respective gain versus level curves for different frequencies are indicated in two-dimensional Gain(L) plots with frequency (f1-f8) as a parameter. Such data material e.g. indicative of a user's hearing ability (impaired or not) can e.g. be generated in a test situation at an audiologist, e.g. by measuring a user's hearing threshold versus frequency. Measurements of the user's uncomfortable level versus frequency may also be performed (or based on empirical observations) to get a 'dynamic range' of appropriate sound levels of the specific user.

Level estimation has been dealt with in numerous prior art documents. One such example is WO2003081947A1 describing a dynamic level estimator, wherein attack and/or release times are (adaptively) determined in dependence of dynamic properties of the input signal (cf. e.g. FIG. 7A, 7B). In WO2003081947A1 the level estimate is performed on a full band signal (one frequency band).

Different level estimation strategies in connection with compressive amplification have been used in the past. Compromises between speech intelligibility and loudness perception have been made. For example, in favour of speech intelligibility, a relatively fast level estimation during time periods with dynamic changes in the input signal has been applied. In favour of loudness perception, relatively slow level estimation during time periods with a more stable input signal has been applied. Such level estimation strategy has been applied in the time domain (on the full band signal), or in a time-frequency domain (band split) configuration. Level estimation in a limited number of frequency bands has e.g. been applied to comply with the experience that fast compression in narrow frequency bands is difficult to manage without deteriorating sound perception (sound quality).

Figure 2:
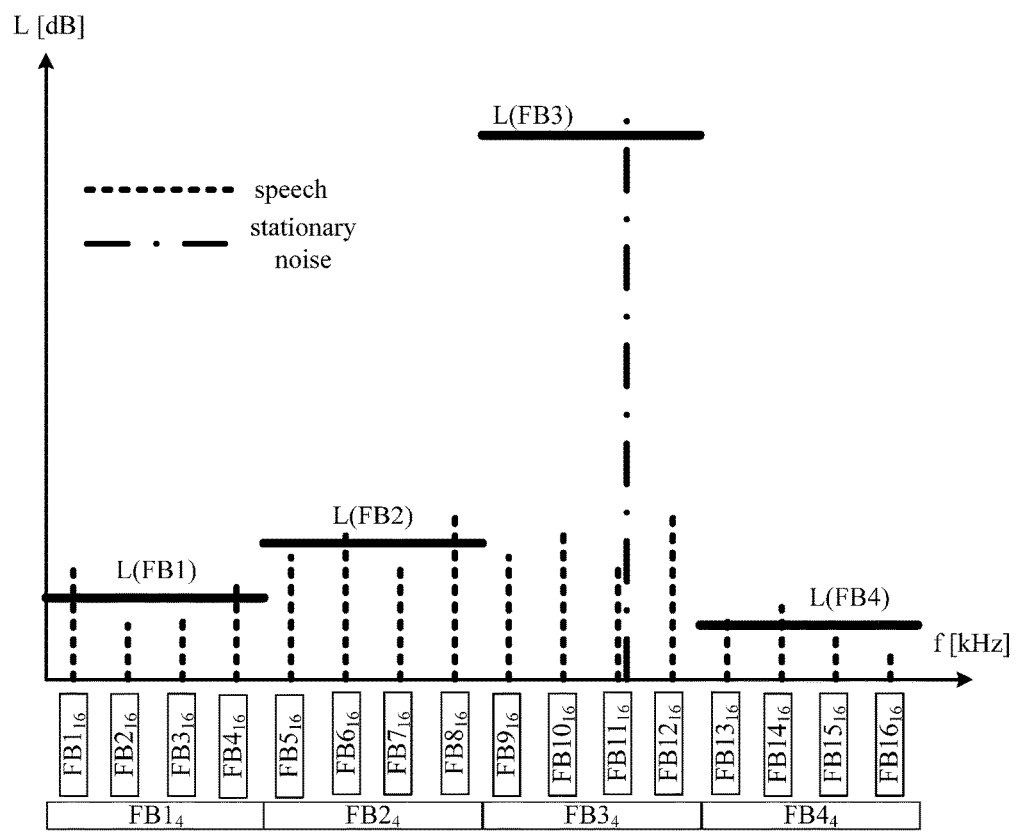
FIG. 2 shows an exemplary level versus frequency graph for a four band level estimator at a given point in time of a specific acoustic situation comprising a soft speech signal and a loud (stationary) narrowband noise signal.

Such strategy has its drawbacks, however, e.g. because stationary narrow band noise influences level estimation over the full range of one of the limited number of (and hence relatively broad) frequency bands. This has the consequence that low-level signal content (e.g. speech) is not amplified and thereby not made audible (masked) by the compressive amplification scheme. This is schematically illustrated in FIG. 2, showing an input signal scenario where the input signal comprises a mixture of a (relatively soft, i.e. low level) speech signal (dotted graphs) and a relatively loud, (e.g. quasi) stationary noise component (dash-dotted graph) at a single frequency. The speech signal comprises signal components distributed in frequency (e.g. between 0 and 8 kHz, here represented by values in 16 frequency bands $FB1_{16}, \ldots, FB16_{16}$), the level (e.g. in dB) of each component being indicated by the height of the vertical line. The noise signal is (in the example) assumed to be concentrated to a single frequency (or to a narrow range around a single frequency, here $FB11_{16}$). The estimated level L of the input signal in four frequency bands $FB1_4$, $FB2_4$, $FB3_4$, $FB4_4$ are indicated by the horizontal bold lines, denoted L(FB1), . . . , L(FB4), respectively. In the exemplary illustration of FIG. 2, frequency bands $FB1_4, \ldots, FB4_4$ and $FB1_{16}, \ldots, FB16_{16}$, may represent low- and high-resolution frequency representations, respectively, of a frequency range of operation of a hearing device, e.g. K2 and K1 of an adaptive level estimator according to the present disclosure (cf. e.g. description of FIG. 3A, 3B, 3C below). In the example of FIG. 2, each of the 4 frequency bands of the low resolution representation spans 4 frequency bands of the high resolution representation, e.g. $FB3_4$ spans $FB9_{16}$, $FB10_{16}$, $FB11_{16}$, $FB12_{16}$. The frequency bands are indicated to be of equal width, but may be different in width, e.g. if assumed shown in a logarithmic frequency scale, or otherwise adapted to the application in question. The frequency of operation may e.g. be between 0 and 8 kHz or between 0 and 10 kHz or any other part of the normal human hearing range (e.g. 20 Hz to 20 kHz). It appears from the example that in the illustrated case, the level estimate in the third frequency band ($FB3_4$) will be determined by the narrowband stationary noise signal (in $FB11_{16}$), e.g. from an electric appliance, or noise in a compartment of a car, etc. As a consequence, the level of the speech part of the signal in the third low-resolution frequency band ($FB3_4$) spanning high resolution frequency bands $FB9_{16}$, $FB10_{16}$, $FB11_{16}$, $FB12_{16}$ will not be estimated correctly. This may lead to decreased intelligibility of the speech signal, because the relatively soft speech components in the third frequency band will not be appropriately amplified (possible attenuated) by a subsequent compression scheme (cf. FIG. 1).

The present disclosure proposes a concept that intends to solve this problem with a view to maintaining a proper sound perception and an acceptable speech intelligibility.

Another driver to a revision of the level estimation strategy, is a trend (due to improvements in digital signal processing and chip developments) to provide signal processing in a forward path of an audio processing device, e.g. a hearing aid, in an increased number of frequency bands, e.g. in 32 bands or more, e.g. in 64 bands or more. Hence, a higher resolution level estimation is needed.

It is, however, the experience that many frequency bands and fast compression sounds bad (which fits with intuition: variance scales inversely with the square root of bandwidth multiplied by time, so a narrow band with a small time constant provides a large variance, which is unwelcome for sound perception).

Hence, a compromise is needed:

According to the same logic an acceptable variance may be provided by

Many frequency bands (small bandwidth) and large time constants (slow compression)

Few frequency bands (large bandwidth) and small time constants (fast compression)

In the present disclosure, it is proposed to provide level estimation in relatively many (e.g. 24 or more) frequency bands for relatively slowly varying input signals; and in relatively few (e.g. 4 or less) frequency bands during fast varying input signals;

and to introduce an appropriate 'fading scheme' between the two.

In other words, the proposed low/high resolution hybrid level estimator has been designed to preserve the qualities a (prior art) level estimator that focuses on adapting time constants in few bands in dependence of the input signal providing fast level estimation when the input signal changes fast (cf. e.g. WO2003081947A1), but combining it with a spectral zoom at more stationary input signals. For this purpose, a separate high-resolution (e.g. more than 16, e.g. 24 channels) calibrated level estimator is used.

The concept of the present disclosure is in general useful in such devices or applications that benefit from a dynamic adaptation of an input signal level to a listener's (possibly limited) dynamic range of sound level perception, or to any other specific dynamic range deviating from that of the environment sound.

Figure 3A:
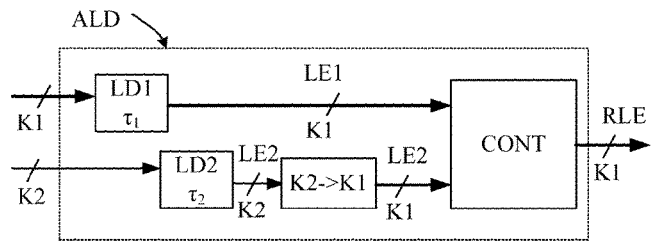
FIG. 3A shows an adaptive level estimator according to a first embodiment of the present disclosure.

FIG. 3A shows an adaptive level estimator (ALD) according to a first embodiment of the present disclosure. The adaptive level estimator is adapted to provide a level estimate RLE of an electric input signal representing sound. The adaptive level estimator (ALD) comprises a first level estimator (LD1 $\tau_1$) configured to provide a first level estimate LE1 of the electric input signal in a first number K1 of frequency bands (based on an input signal in K1 frequency bands), and a second level estimator (LD2 $\tau_2$) configured to provide a second level estimate LE2 of the electric input signal in a second number K2 of frequency bands (based on the input signal in K2 frequency bands). The second number of frequency bands K2 is smaller than the first number of frequency bands K1. In general, the (attack and release) time constants (here commonly denoted $\tau_1$ and $\tau_2$), respectively) of the first (LD1) and second (LD2) level estimators, respectively, fulfil the relation $\tau_1 \geq \tau_2$. In an embodiment, the second level estimator LD2 comprises 4 fast channels (K2=4) and the first level estimator (LD1) comprises 24 slow channels (K1=24), but any combination could be applied ('fast' and 'slow' here implying that $\tau_2 < \tau_1$). A realistic range could be 1-8 fast channels and 1-64 slow channels. In an embodiment, 1 fast channel is used (L2=1). The adaptive level estimator (ALD) further comprises a level control unit (CONT) receiving the first LE1 and second LE2 level estimates and configured to provide the resulting level estimate RLE in K1 frequency bands based on the first and second level estimates (LE1, LE2) in K1 frequency bands. The adaptive level estimator (ALD) further comprises a K2 to K1 band distributor (K2→K1) for translating the K2 level estimates LE2 of the second level estimator (LD2) to K1 level estimates LE2 for direct comparison with the K1 level estimates LE1 of the first level estimator (LD1) in the control unit (CONT).

Figure 3B:
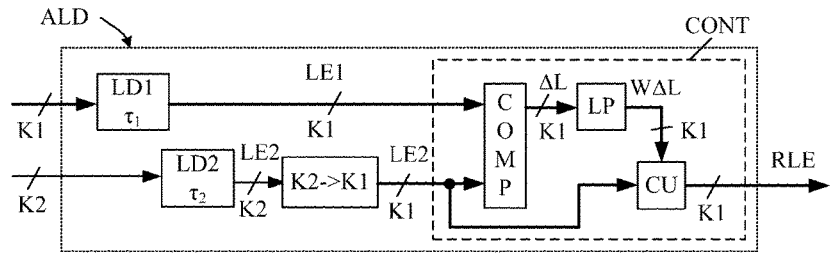
FIG. 3B shows an adaptive level estimator according to a second embodiment of the present disclosure.
Figure 3C:
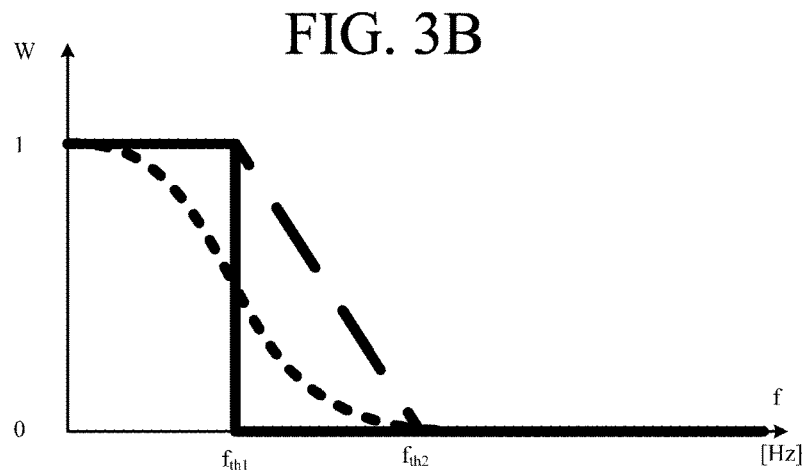
FIG. 3C illustrates a possible effect of the filtering unit as weight (W) between 0 and 1 over frequency.

FIG. 3B shows an adaptive level estimator according to a second embodiment of the present disclosure. The embodiment of FIG. 3B comprises the same functional elements as the embodiment of FIG. 3A. The level control unit (CONT) is, however, described in more detail in FIG. 3B and the following. The level control unit (CONT) comprises a comparison unit (COMP) for comparing first and second level estimates (LE1, LE2), and providing a comparison signal $\Delta L$ indicative of the comparison (in K1 frequency bands). The resulting level estimate RLE of the adaptive level estimator is based on this comparison of the first and second level estimates. The comparison unit (COMP) may e.g. comprise a subtraction unit, so that the comparison signal $\Delta L$ is indicative of a difference between the first and second level estimates (e.g. in a linear or in a logarithmic representation). Alternatively, the resulting level estimate RLE may be based on a ratio between the first and second level estimates (or the inverse). The level control unit (CONT) further comprises a filtering unit (LP) for low pass filtering the comparison signal ΔL and providing a filtered comparison signal WΔL (in K1 frequency bands). The control unit is configured to use the filtered comparison signal WΔL in the determination of the resulting level estimate RLE. The level control unit (CONT) further comprises a combination unit (CU), e.g. a SUM-unit, for combining the filtered comparison signal WΔL with the second level estimate LE2 and providing a combined signal, here equal to the resulting level estimate RLE (in K1 frequency bands). Thereby it can be achieved that the high resolution (first) level estimates are used (or mainly used) as the resulting level estimates for slow changes in the sound level estimate whereas the low resolution (second) level estimates are used (or mainly used) as the resulting level estimates for fast changes in the sound level estimate. An exemplary effect of the filtering unit (LP) implemented as a frequency dependent weight factor W(f) is illustrated in FIG. 3C. FIG. 3C shows three different examples of a weight factor W(f), WΔL=W×ΔL where 'x' represents multiplication. A first course of W(f) (solid line) implements an (ideal) low pass filtering function (a one-step function) for which W=1 for f≤$f_{th1}$ (first threshold frequency, and W=0 for f≥$f_{th1}$. A second course of W(f) (dotted line) implements a gradual transition of W from 1 to 0 for increasing frequencies (e.g. W($f_{th1}$)=0.5, and W=0 for f≥$f_{th2}$ (second threshold frequency)). A third course of W(f) (dashed line) implements a piece-wise linear transition of W from 1 to 0 for increasing frequencies (e.g. W=1 for f≤$f_{th1}$, W=0 for f≥$f_{th2}$, and W decreases linearly from 1 to 0 for increasing frequencies between $f_{th1}$ and $f_{th2}$. Other appropriate courses of the W(f) function representing the effect of the filtering unit (LP) are possible. In an embodiment the first threshold frequency $f_{th1}$ is substantially equivalent to a 3 dB cut-off frequency of a low pass filter. In an embodiment, the first threshold frequency $f_{th1}$ (and/or the second threshold frequency $f_{th2}$) is smaller than or equal to 5 Hz, such as smaller than or equal to 1 Hz, such as smaller than or equal to 0.1 Hz, such as smaller than or equal to 0.01 Hz. In a time constant framework, the filtering function of the LP-unit preferably has time constants in a range from 100 ms to 5 s, e.g. equal to 1 s (for a $1^{st}$ order filter, the relation between cutoff frequency $f_c$ and time constant τ is, τ=1/(2*π*$f_c$)=1/$ω_c$).

Simple min/max limits on the allowable changes to the second level estimates may be applied to be able to control the min and max impact of the slow high resolution estimate. A final calibration stage may be added after the combination unit (CU). A simple scalar scaling unit (e.g. a multiplication unit) may be inserted before the filtering unit (LP) to control the amount of slow high resolution level estimation that is used. A scaling value range [0:1] putting a limit on the size of the correction (e.g. with a default of 1) is proposed.

FIG. 4 shows a hearing device (HD) comprising a forward path from an input unit (IU) to an output unit (OU) via a signal processor (SPU). The hearing device further comprises an adaptive level estimator (ALD) according to a first embodiment of the present disclosure (as shown in FIG. 3A). The hearing aid (HD) comprises an input unit (IU) for providing an electric input signal IN representing sound in a frequency sub-band representation IN(k,m), where k is a frequency sub-band index, k=1, K, where K is the number of frequency sub-bands, and m is a time-frame index. The input unit comprises an input transducer (IT, or a number of input transducers) and a (corresponding number of) time to time-frequency conversion unit(s) (t/f) to convert from a time domain-signal IN(n), n being a time index, to frequency sub-band signals IN(k,m). The input unit (IU) may further comprise a beamformer for providing a spatially filtered signal. The hearing device comprises an adaptive level estimator (ALD) as illustrated and described above in connection with FIG. 3A. The first number K1 of frequency bands used by the first level estimator LD1 is smaller than or equal to the number K of frequency sub-bands of the electric input signal. The provide the appropriate inputs to the first and second level estimators (LD1, LD2) of the adaptive level estimator (ALD), the hearing device comprises appropriate band-sum units (K→K1) and (K→K2) (or K1→K2, if using the output of the K→K1 band-sum unit). Similarly, the hearing device comprises a band distribution unit (K1→K) for converting the resulting level estimate RLE in K1 frequency bands to a resulting level estimate RLE in K frequency bands, which is fed to a signal processor (SPU) of the forward path of the hearing device. The signal processor is configured to run algorithms for processing the electric input signal in K frequency bands, e.g. to compensate for a user's hearing impairment. One of the algorithms is a compressive amplification algorithm that converts the resulting level estimate RLE(k,m) in K frequency bands to corresponding gains G(k,m) in K frequency bands (cf. e.g. FIG. 1). In an embodiment, the compressive amplification algorithm is configured to implement a compression strategy for a specific application (e.g. ear protection, or noise suppression in noisy environments) or for a specific user, e.g. a hearing impaired user. The gains G(k,m) are preferably applied to the input signal IN(k,m) (possible modified by other processing algorithms) to provide a processed signal OUT(k,m). The hearing device (HD) further comprises an output unit (OU), which—based on the processed output signal OUT—provides stimuli perceivable to a user as sound originating from the electric input signal IN. The output unit (OU) comprises a synthesis filter bank (f/t) for converting frequency sub-band signals (OUT(k,m)) to a single time-domain signal (OUT(n)). The output unit (OU) further comprises an output transducer (OT), e.g. comprising a loudspeaker for providing the stimuli as sound waves in air, or a vibrator for providing the stimuli as sound waves in the skull of the user. Alternatively or additionally, the output unit (OU) may comprise a multi-electrode array for providing the stimuli (or some of the stimuli) as electric stimuli of the user's cochlear nerve. The hearing device may e.g. comprise or implement a hearing aid, a headset, an earphone, an ear protection device or a combination thereof.

Figure 4A:
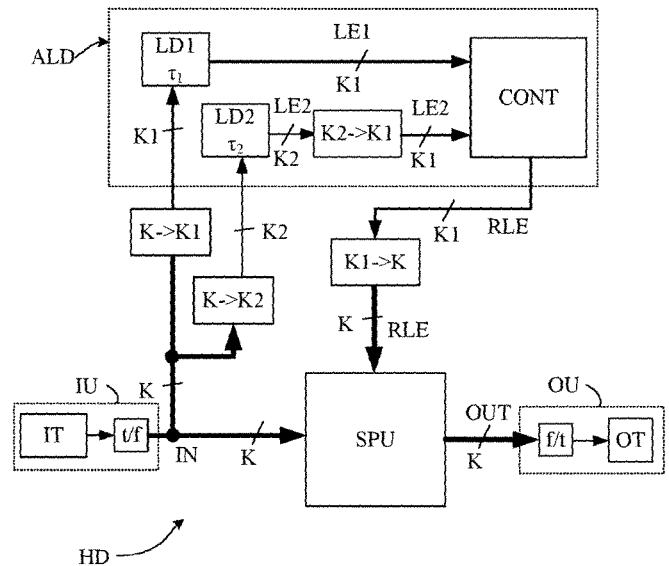
FIG. 4A shows a hearing device comprising an adaptive level estimator according to a first embodiment of the present disclosure.
Figure 4B:
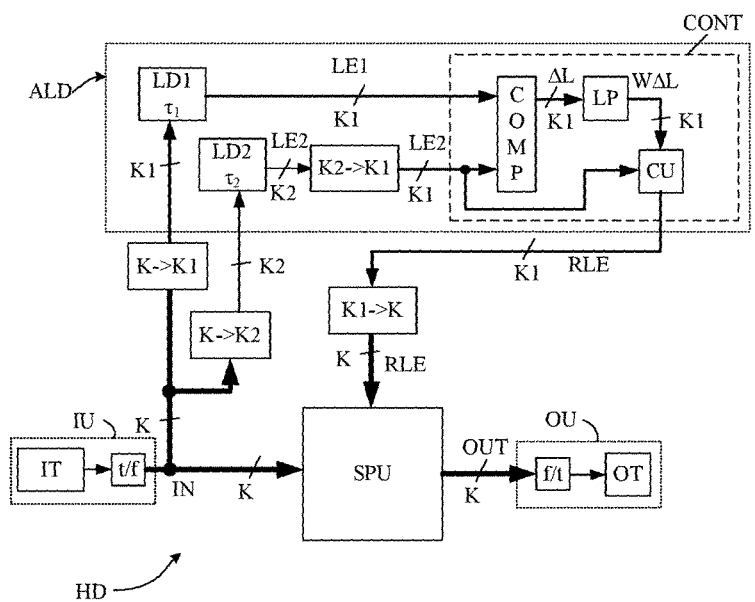
FIG. 4B shows a hearing device comprising an adaptive level estimator according to a second embodiment of the present disclosure.

FIG. 4B shows a hearing device (HD) comprising an adaptive level estimator (ALD) according to a second embodiment of the present disclosure. The embodiment of a hearing device of FIG. 4B is similar to the embodiment of FIG. 4A, but contains another embodiment of the adaptive level estimator (ALD) according to the present disclosure, namely the second embodiment (as shown in FIG. 3B).

Figure 5:
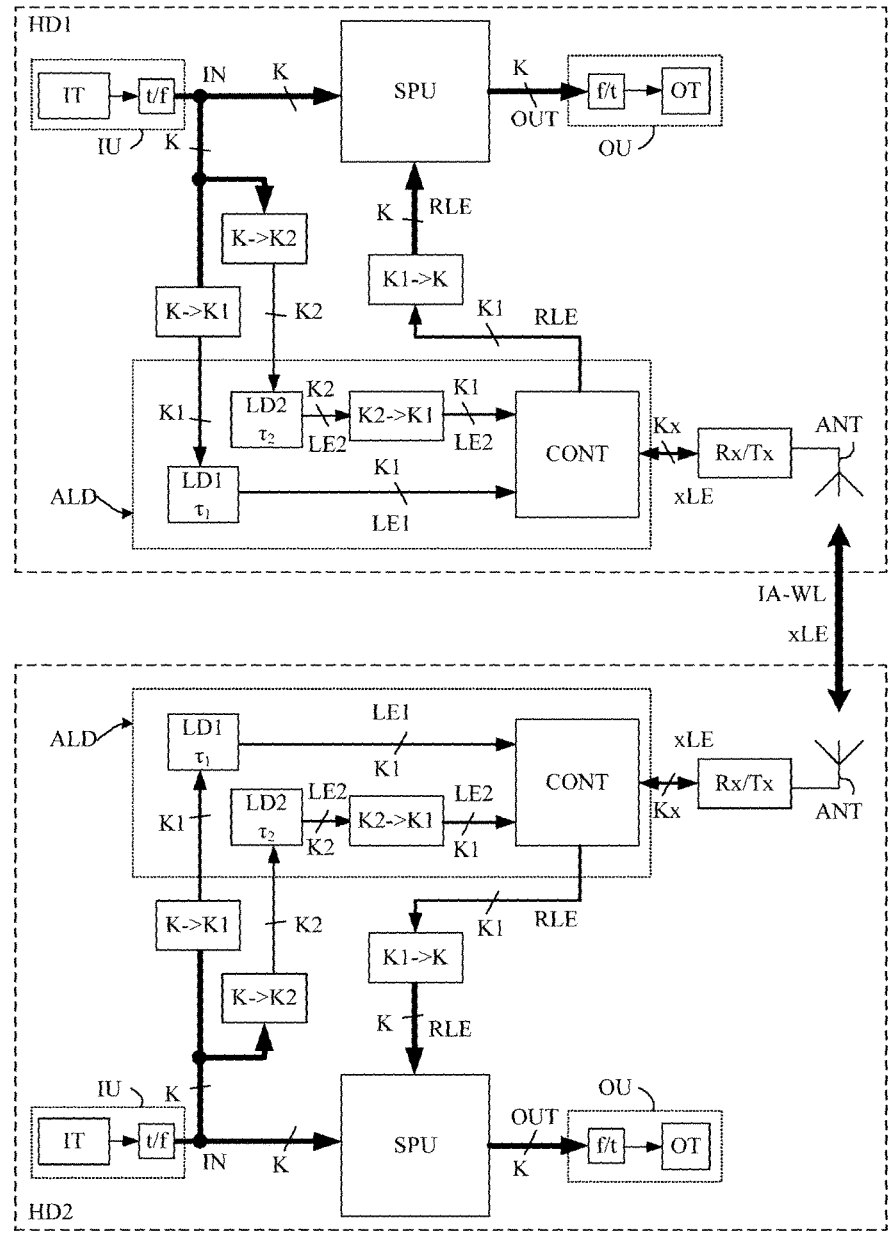
FIG. 5 shows a binaural hearing system comprising first and second hearing devices according to an embodiment of the present disclosure.

FIG. 5 shows a binaural hearing system comprising first and second hearing devices according to an embodiment of the present disclosure. The hybrid high resolution compression scheme may e.g. be used to implement 'binaural compression' as illustrated in FIG. 5, wherein the level estimates (signals xLE in Kx frequency bands) from the respective first and second hearing devices are exchanged between the hearing devices via an interaural wireless link (IA-WL). The first and second hearing devices (HD1, HD2) are hearing devices according to the present disclosure, e.g. as described in FIG. 4A, 4B. The interaural wireless link is implemented in the first and second hearing devices by respective antenna and transceiver circuitry (ANT, Rx/Tx).

The level estimates may be the resulting level estimates (RLE, before comparison with estimates from the other hearing device) in K1 frequency bands, the first level estimate LE1 in K1 frequency bands and/or the second level estimate in K1 or K2 frequency bands.

In an embodiment, it is proposed to only exchange the second level estimates in K2 frequency bands (e.g. in 4 bands). This is very economic in requirements to link-bandwidth and power consumption.

In another embodiment, it is proposed to exchange the first (slow, high resolution) level estimates LE1 in K1 frequency bands between the first and second hearing devices (HD1, HD2). This is illustrated in the hearing device shown in FIG. 6.

The influence of the level estimates xLE received from the other device on the locally determined first level estimate LE1 may be adapted according the application in question, e.g. determined according to a predetermined criterion (e.g. an average, a maximum, or a minimum of the two level estimates in each frequency band). In an embodiment, the influence is adaptively determined, e.g. depending on estimates of a signal to noise ratio of the signals on which the level estimates are based.

Figure 6:
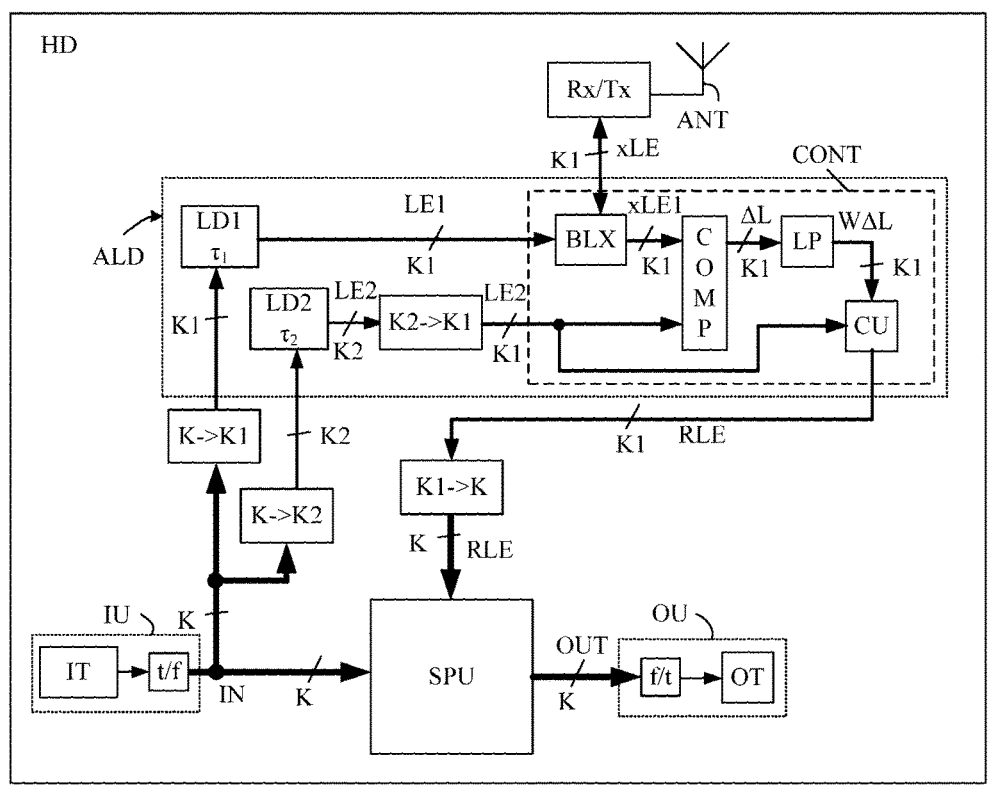
FIG. 6 shows a hearing device comprising an adaptive level estimator according to a third embodiment of the present disclosure, the hearing device being adapted to exchange a first level estimate with another device.

FIG. 6 shows a hearing device (HD) comprising an adaptive level estimator (ALD) according to a third embodiment of the present disclosure. The hearing device (HLD) is a hearing device as described in FIG. 4B further adapted to exchange a first level estimate LE1 with another device (e.g. another hearing device of a binaural hearing system, cf. e.g. FIG. 5). An interaural wireless link is implemented in hearing device (HD) by appropriate antenna and transceiver circuitry (ANT, Rx/Tx), and configured to allow (at least) the exchange of the first level estimate LE1 in K1 frequency bands with another (e.g. hearing) device, cf. signal xLE and indication K1 on double arrowed connection between the transceiver (Rx/Tx) and the BLX-unit. The first (high resolution) level estimate LE1 in FIG. 6 is adjusted by the received (corresponding) first level estimate (xLE) from the other device in binaural adjustment unit BLX providing a binaural level estimate xLE1 in K1 frequency bands, which is fed to the comparison unit COMP (instead of the local first level estimate LE1).

Figure 7A:
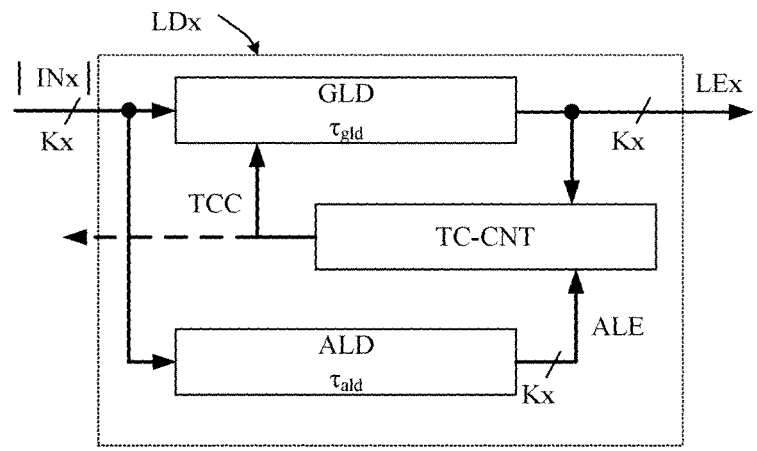
FIG. 7A shows an exemplary structure of a level estimator for use in an adaptive level estimator according to the present disclosure.

FIG. 7A shows an exemplary structure of a dynamic level estimator (LDx) for use in an adaptive level estimator according to the present disclosure (e.g. as level estimators LD1 and/or LD2 in FIG. 3A, 3B or in FIG. 4A, 4B). The dynamic level estimator (LDx) is adapted to provide an estimate LEx of a level of (the magnitude |INx| of) an input signal INx to the dynamic level estimator. Attack and/or release time constant(s) ($\tau_{att}$, $\tau_{rel}$) is/are configurable in dependence of the input signal INx (|INx|). The dynamic level estimator (LDx) comprises a relatively fast level estimator (ALD) connected to a guided level estimator (GLD), both receiving the input signal INx (|INx|) to the dynamic level estimator (LDx). The guided level estimator (GLD) is configured to provide the estimate of the level LEx of the input signal. Attack and/or release time constant(s) ($\tau_{att}$, $\tau_{rel}$) of the guided level estimator (GLD) is/are determined by time constant controller (TC-CNT) in dependence of the level estimates LEx, ALE of the guided level estimator (GLD) and the relatively fast level estimator (ALD), respectively. The time constant controller (TC-CNT) provides control signal TCC for controlling or providing time constants ($\tau_{att}$, $\tau_{rel}$) of the guided level estimator (GLD). The control signal TCC (e.g. the time constants ($\tau_{att}$, $\tau_{rel}$)) is optionally available for external use (as exemplified in FIG. 10), cf. dashed arrow denoted TCC as optional output of LDx. A dynamic level estimator (LDx) as shown in FIG. 7A is e.g. described in WO2003081947A1 (for one frequency band). In the embodiments of an adaptive level estimator shown in FIGS. 3A and 3B, the first and second level estimators (LD1 and LD2) operate in K1 and K2 frequency bands, respectively (i.e. provide K1 and K2 level estimates, respectively). The dynamic level estimator (LDx) may likewise be configurable to provide level estimates in an appropriate number of frequency bands (e.g. K1 or K2 or any other appropriate number, e.g. after appropriate adaptation).

Figure 7B:
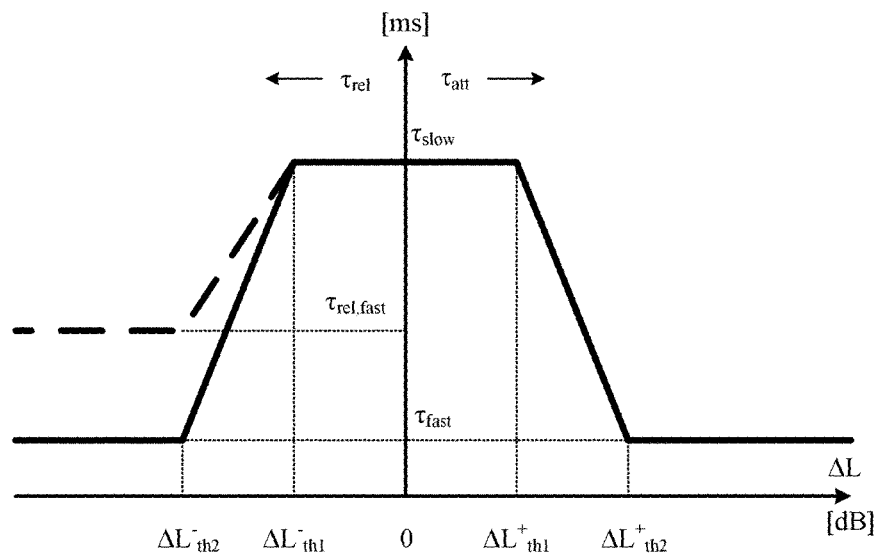
FIG. 7B schematically shows an exemplary scheme for determining attack and release times for the level estimator in dependence of the input signal.

FIG. 7B schematically shows an exemplary scheme for determining attack and release time constants ($\tau_{att}$, $\tau_{rel}$) for the level estimator (LDx) of FIG. 7A in dependence of the input signal INx (|INx|). The graph in FIG. 7B illustrates an exemplary dependence of attack and release time constants ($\tau_{att}$, $\tau_{rel}$) [unit e.g. ms] of the guided level estimator (GLD) in dependence of a difference $\Delta L$ (unit [dB]) between a level estimate ALE of the relatively fast level estimator (ALD) and a level estimate LEx of the guided level estimator (GLD), $\Delta L = ALE - LEx$. FIG. 7B implements a strategy, where relatively large attack and release time constants ($\tau_{slow}$) are applied to the guided level estimator (GLD) in case of (numerically) relatively small (positive or negative) level differences $\Delta L$. For level differences larger than $\Delta L^+_{th1}$ (or smaller than $\Delta L^-_{th1}$), the attack time (or release time) decreases with increasing (or decreasing) value of $\Delta L$, until a threshold value $\Delta L^+_{th2}$ ($\Delta L^-_{th2}$) of the level difference. For level differences larger than $\Delta L^+_{th2}$ (or smaller than $\Delta L^-_{th2}$), the attack (or release) time constant is held at a constant minimum value ($\tau_{fast}$). In the graph of FIG. 7B, the course of the bold solid $\tau(\Delta L)$ curve is symmetrical around 0. This need not be the case however. Likewise, the bold solid $\tau(\Delta L)$ curve also indicates that the attack and release times are of equal size for the same numerical value of the level difference. This needs not be the case either. In an embodiment, the release times are generally larger than the attack times, or at least the release time constants for large negative values of level difference $\Delta L$ ($\Delta L < \Delta L^-_{th1}$), may be larger than the attack time constant for corresponding large positive values of level difference $\Delta L$ ($\Delta L > \Delta L^+_{th1}$). This is indicated by the dashed curve illustrating an alternative course of the release time $\tau_{rel}(\Delta L)$ exhibiting a lager 'fast release time' ($\tau_{rel,fast}$) than for the bold solid curve). Likewise, the release times may be generally larger than the attack times for relatively small level differences (e.g. for $0 \geq \Delta L \geq \Delta L^-_{th1}$ and $0 \leq \Delta L \leq \Delta L^+_{th1}$, respectively). The graph assumes a trapezoid form comprising linear segments between knee points. Other (e.g. curved) functional forms may be implemented. The time constant versus level difference function may be identical for all frequency bands of a given dynamic level estimator. Alternatively, the function may be different for some or all bands. The time constant versus level difference function may be different for the first and second level estimators (LD1, LD2). In an embodiment, the time constants for the first level estimator (LD1) are larger than, such as larger than or equal to, the time constants for the second level estimator (LD1).

Figure 8A:
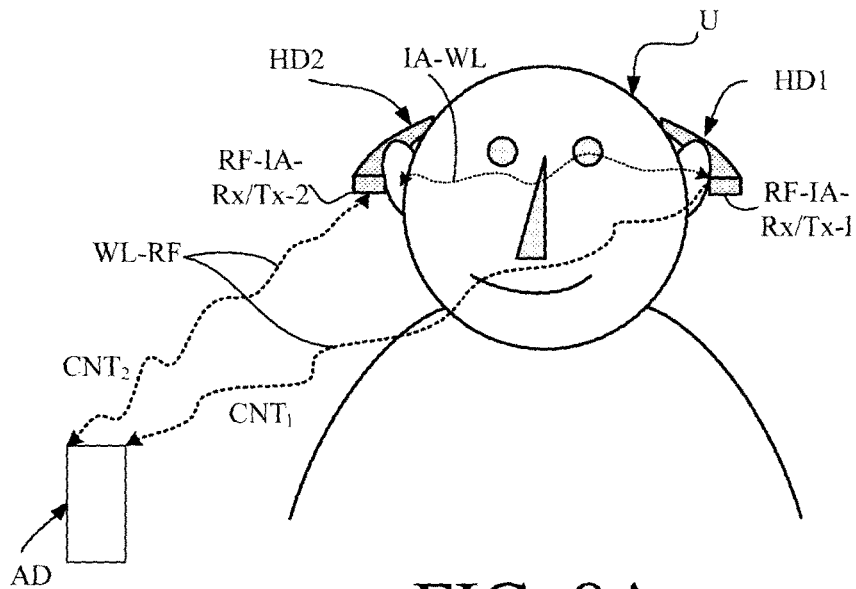
FIG. 8A shows an exemplary application scenario of an embodiment of a hearing system according to the present disclosure, the scenario comprising a user, a binaural hearing aid system and an auxiliary device.
Figure 8B:
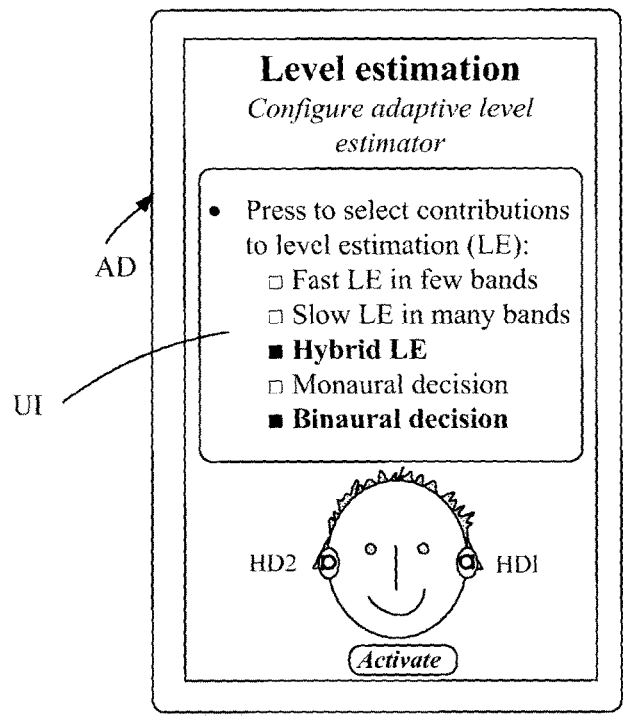
FIG. 8B illustrates the auxiliary device running an APP allowing a user to influence the function of the adaptive level estimator of the respective first and second hearing devices.

FIGS. 8A and 8B illustrate an exemplary application scenario of an embodiment of a hearing system according to the present disclosure. FIG. 8A illustrates a user, a binaural hearing aid system and an auxiliary device. FIG. 8B illustrates the auxiliary device running an APP for controlling the binaural hearing system (specifically level estimation). The APP is a non-transitory application (APP) comprising executable instructions configured to be executed on the auxiliary device to implement a user interface for the hearing device(s) or the hearing system. In the illustrated embodiment, the APP is configured to run on a smartphone, or on another portable device allowing communication with the hearing device(s) or the hearing system.

FIG. 8A shows an embodiment of a binaural hearing aid system comprising left (second) and right (first) hearing devices (HD1, HD2) in communication with a portable (handheld) auxiliary device (AD) functioning as a user interface (UI) for the binaural hearing aid system. In an embodiment, the binaural hearing aid system comprises the auxiliary device AD (and the user interface UI). In the embodiment, the auxiliary device AD comprising the user interface UI is adapted for being held in a hand of a user (U).

In FIG. 8A, wireless links denoted IA-WL (e.g. an inductive link between the left and right devices) and WL-RF (e.g. RF-links (e.g. Bluetooth) between the auxiliary device AD and the left HD1, and between the auxiliary device AD and the right HD2, respectively) are implemented in the devices (HD1, HD2) by corresponding antenna and transceiver circuitry (indicated in FIG. 8A in the left and right hearing devices as RF-IA-Rx/Tx-1 and RF-IA-Rx/Tx-2, respectively). The wireless links are configured to allow an exchange of audio signals and/or information or control signals between the hearing devices (HD1, HD2) and between the hearing devices (HD1, HD2) and the auxiliary device (AD) (cf. signals $CNT_1$, $CNT_2$).

In an embodiment, the auxiliary device AD is or comprises an audio gateway device adapted for receiving a multitude of audio signals (e.g. from an entertainment device, e.g. a TV or a music player, a telephone apparatus, e.g. a mobile telephone or a computer, e.g. a PC, a wireless microphone, etc.) and adapted for allowing the selection of an appropriate one of the received audio signals (or a combination of signals) for transmission to the hearing device. In an embodiment, the auxiliary device is or comprises a remote control for controlling functionality and operation of the hearing device(s). In an embodiment, the function of a remote control is implemented in a SmartPhone, the SmartPhone possibly running an APP allowing to control the functionality of the audio processing device via the SmartPhone (the hearing device(s) comprising an appropriate wireless interface to the SmartPhone, e.g. based on Bluetooth or some other standardized or proprietary scheme).

The exemplary user interface UI of the auxiliary device AD is shown in FIG. 8B. The user interface comprises a display (e.g. a touch sensitive display) displaying a user of the hearing system comprising first and second hearing devices, e.g. hearing aids, (HD1, HD2), and a number of possible choices defining the configuration of the level estimation of the system.

Via the display of the user interface (under the heading Level estimation. Configure adaptive level estimator), the user U is instructed to Press to select contributions to level estimation (LE):
 Fast LE in few bands
 Slow LE in many bands
 Hybrid LE
 Monaural decision
 Binaural decision
Press Activate to initiate selected configuration.

These instructions should prompt the user to select two of the (in this example) five possible contributors to level estimation (one defining the mode of level estimation, the other defining individual (monaural) decision based on the local estimates, or joint (binaural) decision, where the level estimates are based on estimates from both hearing devices. The filled square and bold face writing indicates that the user has selected Hybrid level estimate mode (Hybrid LE) (as proposed in the present disclosure), and binaural mode (Binaural decision), where the level estimates are exchanged between the two hearing devices and used to qualify the resulting estimate of the local level estimator (as also proposed in the present disclosure). When the level estimator has been configured, activation of the selected combination can be initiated by pressing Activate.

Other possible modes of operation of the level estimator may be selected, cf. Fast LE in few bands, Slow LE in many bands, and Monaural decision.

The user interface (UI) may be configured to select Hybrid level estimation and binaural decision as default choices.

In an embodiment, the APP and system are configured to allow other possible choices include 'Fast LE in many bands' and 'Slow LE in few bands'. In an embodiment, 'few' is taken to mean 4 or less. In an embodiment, 'many' is taken to mean 16 or more. The different choices may be tried out in different acoustic situations.

Typically, slow estimation in many bands may be appropriate in a relatively stable (slowly varying) acoustic environment. Typically, fast estimation in few bands may be appropriate in a relatively dynamic (fast varying) acoustic environment.

In an embodiment, the APP is configured to allow the user to set the number of frequency bands in which the level estimation is to be performed in the Fast and Slow LE-modes.

Figure 9:
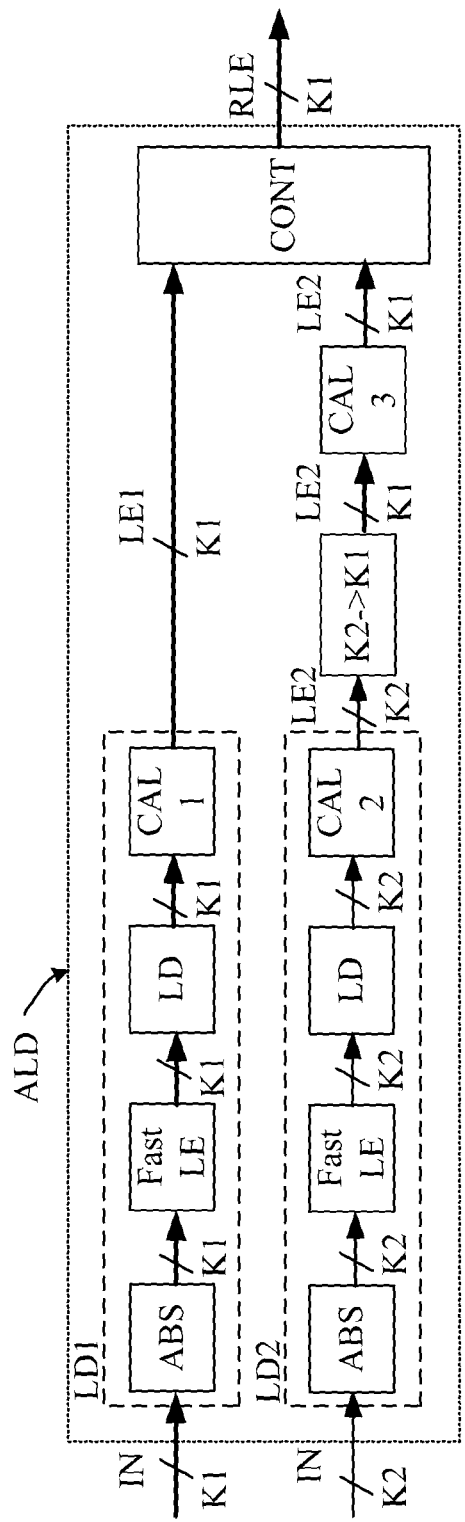
FIG. 9 shows an adaptive level estimator according to a fourth embodiment of the present disclosure.

FIG. 9 shows an adaptive level estimator ALD) according to a fourth embodiment of the present disclosure. The embodiment shown in FIG. 9 comprises the same components as the first embodiment of an adaptive level estimator shown in FIG. 3A. The first and second level estimators (LD1, LD2) are in the embodiment of FIG. 9 shown in more detail. Each of the first and second level estimators comprises an ABS-unit (ABS) for providing a magnitude of the input signal IN (in the respective number of frequency bands K1, K2). The absolute values of the input signal are optionally fed to a level estimator (Fast LE) with small (attack and release) time constants (so that it practically follows the course of the (magnitude of the) input signal IN). The output of the fast level estimator is fed to a level estimator (LD), e.g. a dynamic level estimator, which provides a level estimate in dependence of the input signal (cf. e.g. FIG. 7 and the associated description). Each of the first and second level estimators (LD1, LD2) comprises a calibration unit (CAL1 and CAL2, respectively) for calibrating the first and second level estimates to a particular type of sound signals (e.g. to sound signals comprising speech, possibly to different types of sound signals). The calibrated first level estimate LE1 (K1 bands) is fed to the control unit (CONT). The calibrated second level estimate LE2 (K2 bands) is fed to the band distribution unit (K2→K1). Additionally, the adaptive level estimator comprises a third calibration unit (CAL3) for calibration the second level estimate LE2 after the band distribution unit (K2→K1). The third calibration unit (CAL3) is configured to calibrate the resulting level estimate to a particular type of sound signals. The calibrated second level estimate LE2 (K1 bands) is fed to the control unit (CONT) for comparison with the calibrated first level estimate LE1 (K1 bands) and for further processing to provide the resulting level estimate RLE (K1 bands). The resulting level estimate RLE may e.g. be used in a compressive amplification algorithm (cf. e.g. L2G unit in FIG. 10) or in a maximum power output algorithm.

Figure 10:
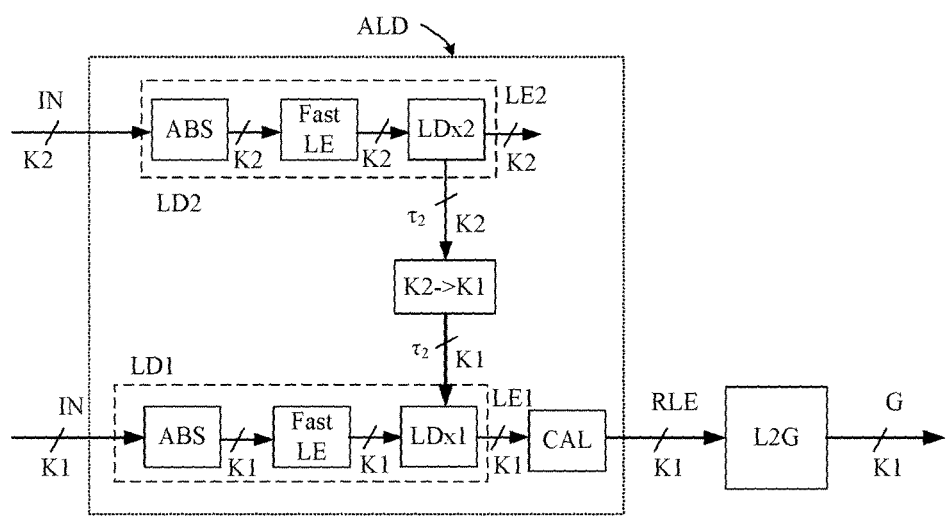
FIG. 10 illustrates an adaptive level estimator according to a fifth embodiment of the present disclosure.

FIG. 10 illustrates an adaptive level estimator according to a fifth embodiment of the present disclosure for providing a resulting level estimate RLE (in a number K1 of frequency bands) of an input signal IN. The embodiment of FIG. 10 provides hybrid high resolution level estimation (e.g. for use in compression, cf. L2G unit in FIG. 10) by controlling the time constants $\tau_1$ (e.g. attack and release time constants, ($\tau_{att,1}, \tau_{rel,1}$)) in a high resolution level estimator (LD1) from a lower resolution level estimator (LD2). The time constants $\tau_2$ from the K2 (e.g. 4) level estimators of low-resolution level estimator LD2 are distributed (cf. distribution unit K2→K1 in FIG. 10 providing K1 time constants $\tau_2$) to the K1 (e.g. 24) level estimators of the high-resolution level estimator LD1, which—based thereon—provides a resulting level estimate RLE in K1 frequency bands. Any number for K2, say 1 to 8, and for K1 (>K2), say K2+1 to 64 could be used.

The upper branch represents the low resolution adaptive level estimator LD2, e.g. based on a dynamic level estimator LDx (LDx2), as described in connection with FIG. 7A, 7B with relatively few channels (frequency bands). In the present case, a realistic number for K2 could be anything between 1 and 8, e.g. 4.

The lower branch shows a high resolution level estimator LD1 comprising a dynamic level estimator LDx (LDx1) with relatively many channels (K1>K2). In the present case a realistic number could be anything between 2 and 64, e.g. 24.

The idea is that the upper branch (low resolution level estimator LD2) decides the time constants to be small (fast) or large (slow) based on dynamic level estimator LDx2. These time constants $\tau_2$ are then distributed to the lower, multichannel branch (high resolution level estimator LD1). This configuration provides that the attack and release time constants of the high resolution level estimator LD1 are determined in "chunks" defined by the channels in the upper branch (cf. e.g. FIG. 2). This means that if one of the K2 channels (e.g. the second, cf. FB2$_4$ in FIG. 2) in the low resolution level estimator LD2 (at a given time) has a small time constant ($\tau_2$(FB2$_4$), i.e. fast attack/release time constants ($\tau_{att,2}$(FB2$_4$), $\tau_{rel,2}$(FB2$_4$))), then (all) the channels in the high resolution estimator LD1 associated with this channel (e.g. channels FB5$_{16}$, FB6$_{16}$, FB7$_{16}$, FB8$_{16}$ in FIG. 2) will get a small time constant (react fast) as well (e.g. be equal to $\tau_2$(FB2$_4$) or to have a predetermined dependence of $\tau_2$(FB2$_4$)).

The result is that an adaptive level estimator (ALD) running in many channels (high resolution) is provided, but with (attack and release) time constants, which are determined and updated in few channels (low resolution).

In another embodiment, the level control unit receiving the first and second level estimates is configured to provide the resulting level estimate based on the first and second level estimates and a signal to noise ratio of the electric input signal.

In the above description, the level estimation concept has been exemplified by use in compressive amplification. The same concept can, however, be applied to other functions, e.g. maximum power output (MPO). The MPO will potentially have to be setup differently from the compression (e.g. regarding time constants and/or number of frequency bands, and/or fading scheme between low and high resolution level detection).

It is intended that the structural features of the devices described above, either in the detailed description and/or in the claims, may be combined with steps of the method, when appropriately substituted by a corresponding process.

As used, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element but intervening elements may also be present, unless expressly stated otherwise. Furthermore, "connected" or "coupled" as used herein may include wirelessly connected or coupled. As used herein, the term "and/or" includes any and all combinations of one or more of the associated listed items. The steps of any disclosed method is not limited to the exact order stated herein, unless expressly stated otherwise.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follow.

REFERENCES

WO2003081947A1 (OTICON) Feb. 10, 2003

The invention claimed is:

1. An adaptive level estimator for providing a level estimate of an electric input signal representing sound, the adaptive level estimator comprising:
- a first level estimator configured to provide a first level estimate of the electric input signal in a first number K1 of frequency bands;
- a second level estimator configured to provide a second level estimate of the electric input signal or attack/release time constants associated with said second level estimate in a second number K2 of frequency bands, wherein K2 is smaller than K1; and
- a level control unit configured to provide a resulting level estimate based on said first level estimates, and on said second level estimates or said attack/release time constants associated with said second level estimates,
- wherein said first level estimator is configured to provide said first level estimate with a first time constant ($\tau$1), and wherein said second level estimator is configured to provide said second level estimate with a second time constant (τ2), wherein said first time constant is larger than or equal to said second time constant, and wherein said level control unit is further configured to provide said resulting level estimate as said first level estimates in a relatively stable, slowly varying, acoustic environment, and as said second level estimates in a relatively dynamic, fast varying, acoustic environment.

2. An adaptive level estimator according to claim 1 wherein said level control unit comprises a comparison unit for comparing said first and second level estimates, and providing a comparison signal indicative of said comparison.

3. An adaptive level estimator according to claim 2 wherein said level control unit comprises a filtering unit for down-sampling or low pass filtering said comparison signal, and providing a filtered comparison signal.

4. An adaptive level estimator according to claim 3 wherein said level control unit comprises a combination unit for combining said filtered comparison signal or a signal derived therefrom with said second level estimate and providing a combined signal.

5. An adaptive level estimator according to claim 2 wherein said level control unit comprises a limiter configured to limit the effect of the comparison signal on the resulting level estimate.

6. An adaptive level estimator according to claim 1 wherein the first and/or second level estimator comprises a dynamic level estimator providing an estimate of a level of an input signal to the dynamic level estimator, wherein attack and/or release time constant(s) is/are configurable in dependence of the input signal to the dynamic level estimator.

7. An adaptive level estimator according to claim 1 comprising at least one calibrator for calibrating a level estimate to a particular type of sound signals.

8. A hearing device, e.g. a hearing aid, comprising an adaptive level estimator according to claim 1.

9. A hearing device according to claim 8 comprising an input unit for providing an electric input signal representing sound in a frequency sub-band representation IN(k,m), where k is a frequency sub-band index, k=1, . . . , K, where K is the number of frequency sub-bands, and m is a time-frame index.

10. A hearing device according to claim 8 comprising an output unit for providing stimuli perceivable to a user as sound originating from said electric input signal.

11. A hearing device according to claim 8 comprising a level to gain conversion unit for converting said resulting level to a resulting gain.

12. A hearing device according to claim 8 consisting of or comprising a hearing aid, a headset, an earphone, an ear protection device or a combination thereof.

13. A binaural hearing system comprising first and second hearing devices according to claim 8 the hearing system being adapted to establish a communication link between the first and second hearing devices.

14. A binaural hearing system according to claim 13 comprising an auxiliary device, the hearing system being adapted to provide that information can be exchanged between at least one of the first and second hearing devices and the auxiliary device or forwarded from at least one of the first and second hearing devices to the auxiliary device.

15. A method of dynamic estimation of a level of an input signal representing sound, comprising
providing a first level estimate of the electric input signal in a first number K1 of frequency bands;
providing a second level estimate of the electric input signal and/or attack/release time constants associated with said second level estimate in a second number K2 of frequency bands, wherein K2 is smaller than K1;
providing a resulting level estimate based on said first level estimates, and on said second level estimates or said attack/release time constants associated with said second level estimates;
providing said first level estimate with a first time constant,
providing said second level estimate with a second time constant, wherein said first time constant is larger than or equal to said second time constant, and
providing that the first level estimates are used or mainly used as the resulting level estimates for slow changes in the sound level estimate, whereas the second level estimates are used or mainly used as the resulting level estimates for fast changes in the sound level estimate.

16. Use of a level estimator as claimed in claim 1 in an audio processing device, e.g. a hearing aid.

17. A data processing system comprising a processor and program code means for causing the processor to perform the method of claim 15.

18. A computer program product comprising instructions which, when the program is executed by a computer, cause the computer to carry out the method of claim 15.

19. A non-transitory computer-readable medium storing executable instructions configured to be executed on an auxiliary device to implement a user interface for a hearing device according to claim 8 specifically adapted to allow a configuration of the adaptive level estimator in said hearing device to be performed via said user interface.

* * * * *